US 6,573,611 B1

(12) United States Patent
Sohn et al.

(10) Patent No.: US 6,573,611 B1
(45) Date of Patent: Jun. 3, 2003

(54) DUAL-LEAD TYPE SQUARE SEMICONDUCTOR PACKAGE AND DUAL IN-LINE MEMORY MODULE USING THE SAME

(75) Inventors: Hai Jeong Sohn, Kyungki-do (KR); Jun Young Jeon, Seoul (KR); Young Hee Song, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/624,553

(22) Filed: Jul. 24, 2000

(30) Foreign Application Priority Data

Nov. 24, 1999 (KR) .............................................. 99-52483

(51) Int. Cl.[7] .............................................. H01L 23/48
(52) U.S. Cl. ....................................... 257/780; 257/787
(58) Field of Search ................................... 257/780, 787

(56) References Cited

U.S. PATENT DOCUMENTS

| 5,220,195 | A | * | 6/1993 | McShane et al. ............ 257/666 |
| 5,391,922 | A | * | 2/1995 | Matsui ......................... 257/685 |
| 5,438,536 | A | * | 8/1995 | Salzman ....................... 365/52 |
| 5,642,262 | A | * | 6/1997 | Terrill et al. ................. 174/261 |
| 5,687,109 | A | * | 11/1997 | Protigal et al. ............... 365/63 |
| 5,907,186 | A | * | 5/1999 | Kang et al. .................. 257/666 |
| 5,966,021 | A | * | 10/1999 | Eliashberg et al. ......... 324/158.1 |
| 6,060,339 | A | * | 5/2000 | Akram et al. ................ 438/106 |
| 6,340,837 | B1 | * | 1/2002 | Miyaki et al. ............... 257/666 |

FOREIGN PATENT DOCUMENTS

JP             11251506 A    *   9/1999

OTHER PUBLICATIONS

Comprehensive Dictionary of Electrical Engineering 1999, CRC Press/IEEE Press, p. 363.*

* cited by examiner

Primary Examiner—Nathan J. Flynn
Assistant Examiner—Leonardo Andujar
(74) Attorney, Agent, or Firm—Volentine Francos, PLLC

(57) ABSTRACT

Dual-lead type substantially square semiconductor packages and dual in-line memory modules using them are disclosed. The conventional memory module is internationally standardized, so it is hard to increase memory density by adding current packages to the module. The substantially square semiconductor packages provide improved and smaller packages in which a package length and a pin pitch are reduced, so that the memory density is increased without modifying a module size. The length of the leads are preferably substantially equal.

23 Claims, 6 Drawing Sheets

DUAL-LEAD TYPE SQUARE SEMICONDUCTOR PACKAGE AND DUAL IN-LINE MEMORY MODULE USING THE SAME

Cross-references to Related Applications

The present application claims priority under 35 U.S.C. § 119 to Korean Patent Application No. 99-52483 filed on Nov. 24, 1999, the entire contents of which are hereby incorporated by reference for all purposes.

BACKGROUND OF THE INVENTION

1. Field of the Invention

The present invention relates to a semiconductor device in general. More particularly, the present invention relates to a dual-lead type substantially square semiconductor package, the size of which is reduced as compared with conventional one, and to a dual in-line memory module on both faces of which the size-reduced square packages are mounted, thereby realizing an increase in memory density of a standard memory module.

2. Description of the Prior Art

The major trend in the semiconductor industry today is to make products smaller, thinner, lighter, more integrated, and denser. This trend has been applied to a dual in-line memory module (DIMM) on both faces of which plural semiconductor packages are provided and attached. In particular, several electronic devices, such as notebook computers, personal digital assistants, server, work station, and the like, require improved memory modules of higher density more than ever.

The DIMM is standardized by international organization for semiconductor such as JEDEC (Joint Electron Device Engineering Council). For example, a standard DIMM of a 1250±6 mil×2660±6 mil size and a 150 mil maximum thickness is recommended to use eight TSOP (Thin Small Outline Packages) each of which has a 11.76±0.2 mm width, a 22.22±0.127 mm length, a 1.2 mm maximum thickness, a 0.8±0.05 mm pin pitch, and fifty-four pins.

In the standard memory module, the only way to increase the memory density by using current memory devices is to increase the number of packages to be mounted on the module. The packages to be added should be mounted near or stacked onto the already mounted packages, so that the size or thickness of the module is inevitably increased. However, since the size and thickness of the module are already standardized as stated above, it is actually impossible to add the conventional packages to the standard module.

SUMMARY OF THE INVENTION

The present invention is therefore directed to a substantially square semiconductor package having reduced length and pitch, and to a memory module having a higher density which substantially overcomes one or more of the problems due to the limitations and disadvantages of the related art.

It is therefore an object of the present invention to provide an improved memory module having a higher density without modifying the size of the memory module, and to provide an improved and smaller semiconductor package to be used for the improved memory module.

In a first aspect of the present invention, a semiconductor package is provided. The semiconductor package includes a substantially square package body that includes opposing first sides defining a body width and opposing second sides defining a body length. The semiconductor package also includes a semiconductor chip that includes a top surface and a plurality of bonding pads formed on the top surface thereof. The bonding pads are arranged parallel to the opposing second sides on a central region of the top surface, and the semiconductor chip is provided within the package body. The semiconductor package further includes a plurality of leads, each of which has inner and outer ends. The inner ends extend over the top surface of the semiconductor chip within the package body, and electrically connect to the bonding pads. The outer ends protrude from the package body along the opposing second sides. Preferably, a ratio of the body length to the body width ranges from 0.9 to 1.1.

In a second aspect of the present invention, another semiconductor package is provided. The semiconductor package includes a package body that includes opposing first sides having a first length and opposing second sides having a second length. The semiconductor package also includes a semiconductor chip that includes a top surface and a plurality of bonding pads formed on the top surface thereof. The bonding pads are arranged parallel to the opposing second sides on a central region of the top surface, and the semiconductor chip is provided within the package body. The semiconductor package further includes a plurality of leads, each of which has inner and outer leads. The inner leads extend over the top surface of the semiconductor chip within the package body, and electrically connect to the bonding pads. The outer leads protrude from the package body along the opposing second sides. In particular, the second length is longer than the first length and shorter than a distance from the outer leads at one of the second sides to the opposing outer leads at the other second side.

In another aspect of the present invention, a memory module is provided. The memory module includes a circuit substrate that includes upper and lower faces on each of which given circuit patterns are formed. The memory module also includes a plurality of semiconductor packages, each of which is provided according to either of the above aspects of the present invention. The packages are provided on the upper and lower faces, and electrically connected to the circuit patterns. In the memory modules, the packages on each face of the circuit substrate are arranged in at least two lengthwise rows and at least two widthwise rows.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which.

DETAILED DESCRIPTION OF THE INVENTION

Figure 1:
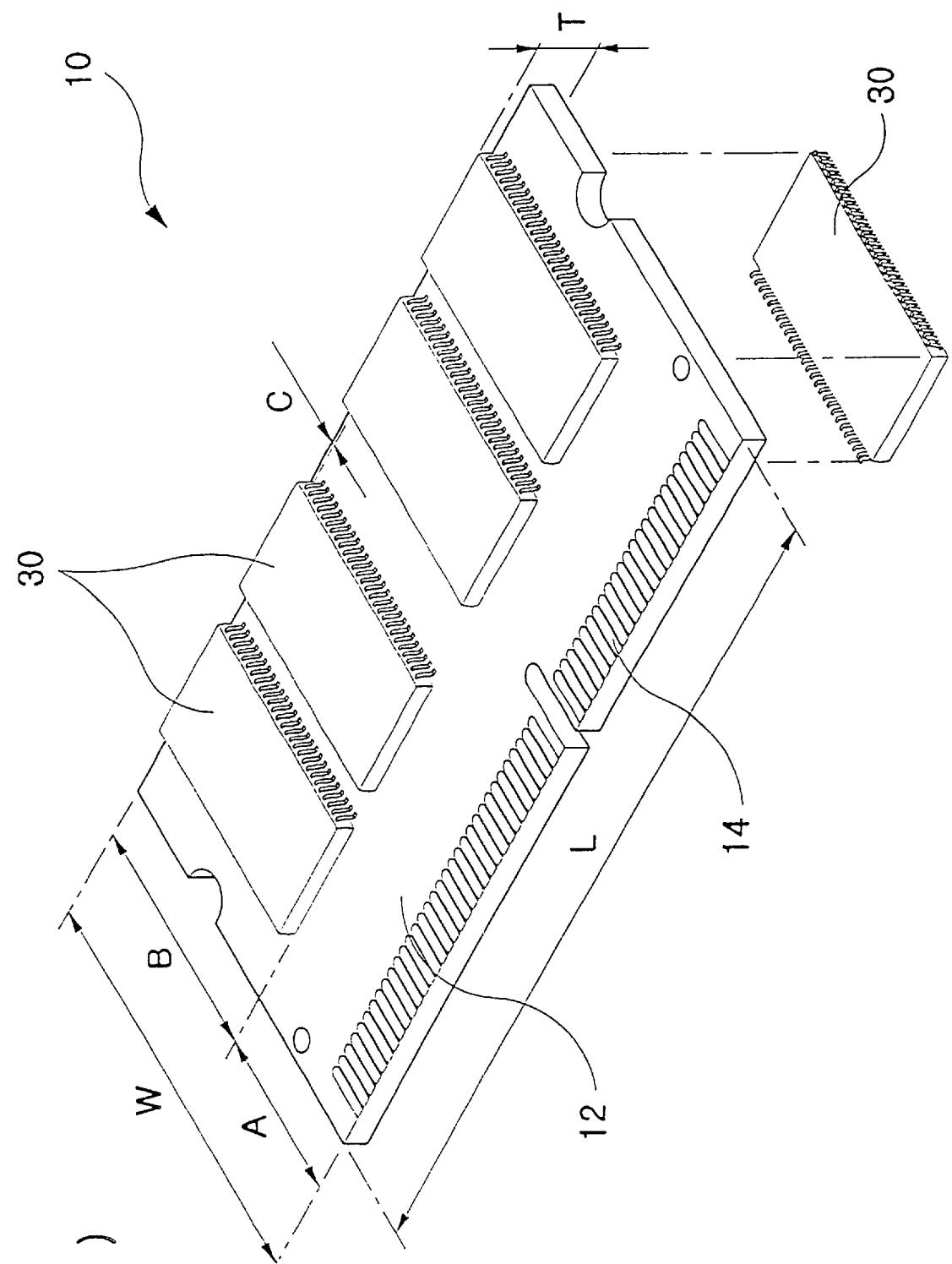
FIG. 1 is a perspective view showing an example of a conventional dual in-line memory module.

The present invention will now be described more fully hereinafter with reference to accompanying drawings, as compared with the prior art. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

Figure 2:
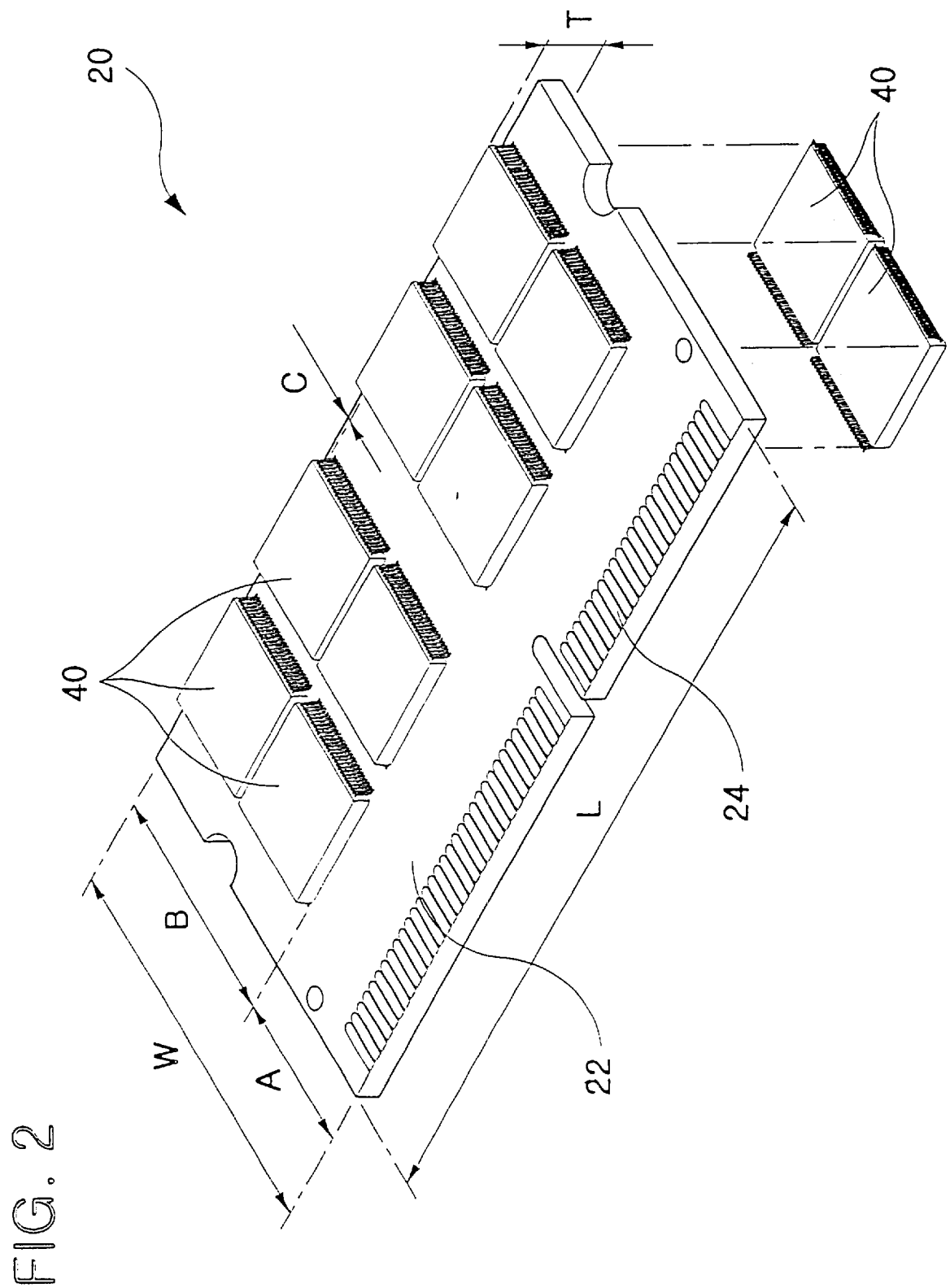
FIG. 2 is a perspective view showing a dual in-line memory module according to one embodiment of the present invention.

FIG. 1 shows, in a perspective view, an example of a conventional dual in-line memory module (10). FIG. 2 shows, in a perspective view, a dual in-line memory module (20) according to one embodiment of the present invention. Both of the memory modules (10, 20) shown in FIGS. 1 and 2 use a type of 128 Mb TSOP having fifty-four pins.

As shown in FIG. 1, the conventional memory module (10) includes eight semiconductor packages (30), four of which are mounted on respective upper and lower faces of a circuit substrate (12). The density of the memory module (10) is therefore 5 128 MB. In order to double this density, eight more packages need to be added. However, since the size of the memory module (10) has been already standardized, i.e., fixed, as stated above, it is not actually possible to add the packages to the standard module without extending the size of the module. The memory module (10) depicted in FIG. 1 has a size of a 1250±6 mil width (W) and a 2660±6 mil length (L). In addition, the total thickness (T) of the memory module (10), including a thickness of the mounted packages (30), is 3.4 mm, which cannot exceed 150 mil (3.8 mm).

On the other hand, the memory module (20) according to the present embodiment includes sixteen semiconductor packages (40), eight of which are mounted on respective upper and lower faces of a circuit substrate (22). The size of the memory module (20) of the present embodiment is equal to that of the conventional module (10 in FIG. 1). The size of the semiconductor package (40) of the present embodiment is, by contrast, reduced to half as much as the conventional package (20 in FIG. 1). Therefore, the present embodiment can provide the memory module (20) with the reduced packages (40) in two rows, maintaining the size of the module as it is, so that the density of the module can be increased. Such a memory module of the present invention is referred to as SODIMM (small outline dual in-line memory module).

Although some given circuit patterns are actually formed on the circuit substrate (22) of the memory module (20), the circuit patterns are omitted in FIGS. 1 and 2 for clarity of illustration. Reference numerals 14 in FIGS. 1 and 24 in FIG. 2 designate contact pads that provide electrical path between the memory module and external electronic device when the module is inserted into a socket of electronic devices such as notebook computers. The memory modules illustrated in FIGS. 1 and 2 are divided into three sections labeled A, B, and C. The section A is a portion required to insert the memory module into the socket. The section C is a portion required to prevent damage to the packages during the insertion or separation of the module into or from the socket. Therefore, a portion actually available to use for mounting the packages is limited to the section B.

Figure 3:
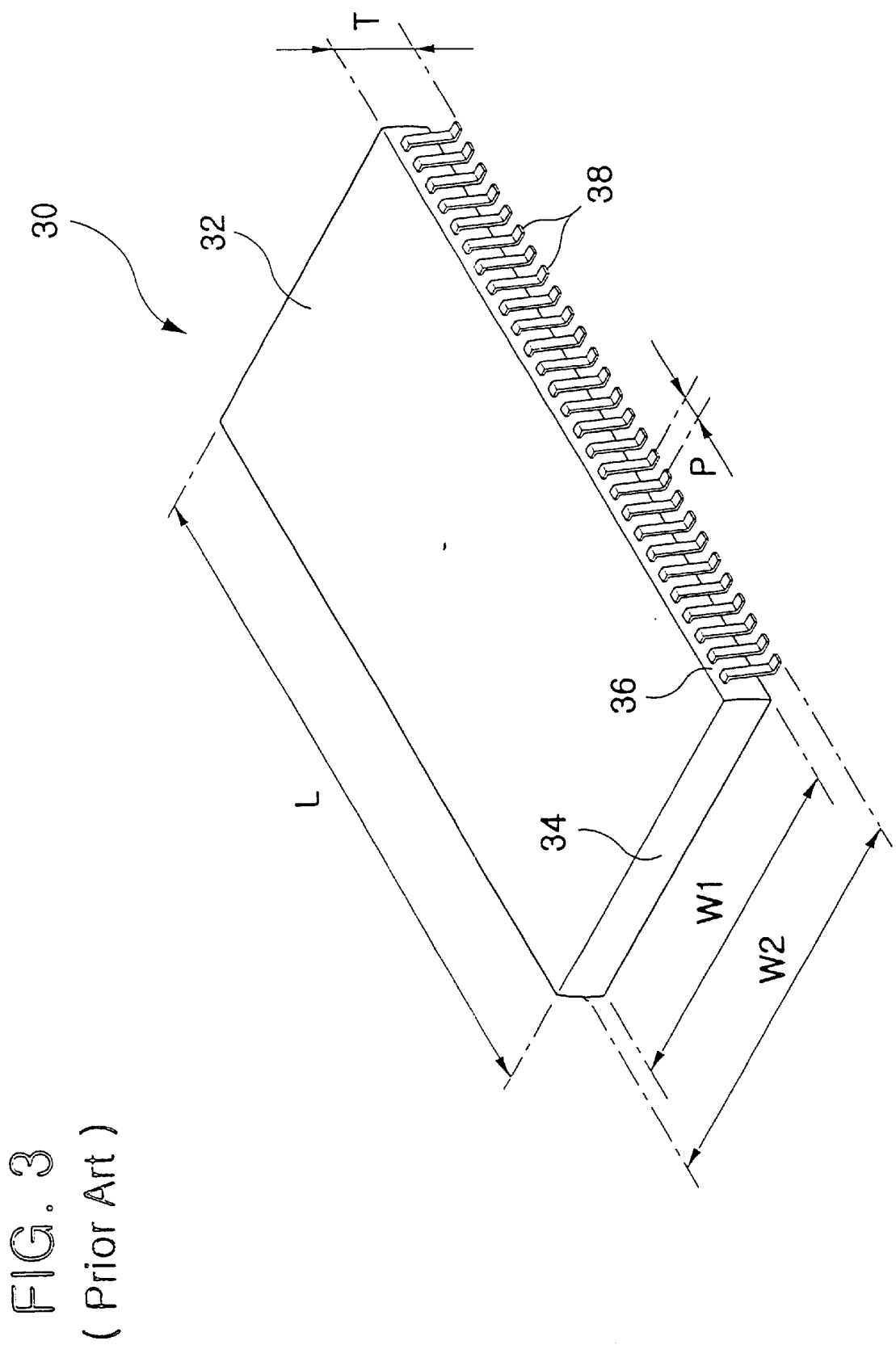
FIG. 3 is a perspective view showing a conventional semiconductor package used for the conventional memory module shown in FIG. 1.
Figure 4:
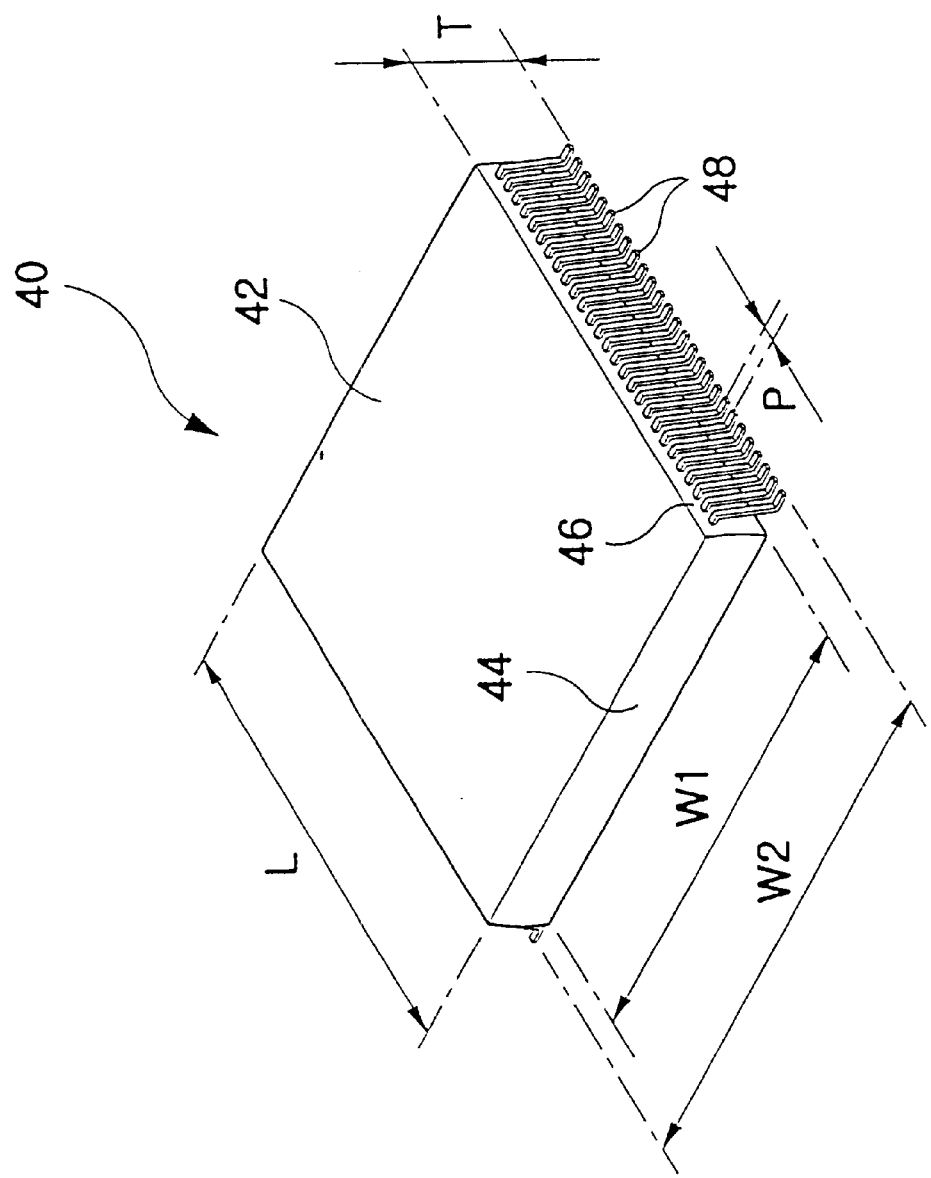
FIG. 4 is a perspective view showing a semiconductor package used for the improved memory module shown in FIG. 2 according to another embodiment of the present invention.

FIG. 3 illustrates, in a perspective view, the conventional semiconductor package (30) used for the conventional memory module shown in FIG. 1. Further, FIG. 4 illustrates, in a perspective view, the semiconductor package (40) used for the improved memory module shown in FIG. 2 according to another embodiment of the present invention. Both of the semiconductor packages (30, 40) shown in FIGS. 3 and 4 are types of TSOP having fifty-four pins. Opposing first sides (34, 44) of the package body (32, 42) have no lead, whereas opposing second sides (36, 46) have plural leads (38, 48). That is, the semiconductor package is a type of dual-lead package.

A comparison between the sizes of the both packages is as follows. As shown in FIG. 3, the prior package (30) has a 11.76±0.2 mm width (W2), a 22.22±0.127 mm length (L), and a 1.2 mm maximum thickness (T). However, as shown in FIG. 4, the package (40) of the present embodiment has a 11.76±0.2 mm width (W2), a 11.20±0.127 mm length (L), and a 1.2 mm maximum thickness (T). The above width (W2) of the package is defined as including the leads (38, 48) that protrude from the second sides (36, 46) of the package body (32, 42). The pure width (W1) of the package body (32, 42) itself is 10.16±0.127 mm. A pitch (P) between the adjacent leads (38, 48), i.e., a pin pitch, is reduced to 0.4±0.05 mm of the present embodiment from 0.8±0.05 mm of the prior art.

As can be seen from the above comparison, the widths (W1, W2) and thickness (T) of the invented package are equal to those of the conventional package, however the length (L) and pitch (P) of the invented package are reduced to half that of the conventional package. According to the present invention, the length of the second sides (46) of the package (i.e., the length L of the package body) is longer than that of the first sides (44) (i.e., the width W1 of the package body), and shorter than a distance from the leads (48) at one of the second sides (46) to the opposing leads (48) at the other second side (46) (i.e., the total width W2 of the package).

Although the present invention has been described hereinbefore in one embodiment of fifty-four pins TSOP, the invention should not be limited to any specific type of the package. The present invention can be also embodied in the other package types such as, for example, fifty or forty-four pins TSOP widely used in the art, or other dual-lead type packages. Considering several types of the packages, a ratio (L/W) of the body length (L) to the body width (W1) in the semiconductor package of the present invention preferably ranges from substantially 0.9 to substantially 1.1. That is, the package of the present invention is a substantially square package. Examples of the configurations in these ranges are set forth below in Table 1, with the units being in mm.

TABLE 1

| Configuration | Package length (L) | Package body width (W1) | Package total width (W2) | W1/L | W2/L |
|---|---|---|---|---|---|
| 54TSOP | 11.20 | 10.16 | 11.76 | 0.91 | 1.05 |
| 50TSOP | 10.80 | | | 0.94 | 1.09 |
| 44TSOP | 11.30 | | | 0.90 | 1.04 |

A comparison of these parameters to those of the related art are shown in Table 2, in which the numbers on the left of the arrow are those of the related art and the numbers on the right of the arrow are those of the present invention, with all units being in mm.

TABLE 2

| Package Type | 54TSOP | 50TSOP | 44TSOP |
|---|---|---|---|
| L | 22.22 → 11.20 | 20.95 → 10.80 | 18.41 → 11.30 |
| W1 | | 10.16 → 10.16 (unchanged) | |
| W2 | | 11.76 → 11.76 (unchanged) | |
| Lead Pitch | 0.8 → 0.4 | 0.8 → 0.4 | 0.8 → 0.5 |
| Range of Lead Length | 3.8~8.4 → 3.8~4.5 | 3.8~7.75 → 3.8~4.5 | 3.8~6.8 → 3.8~4.5 |

Figure 5:
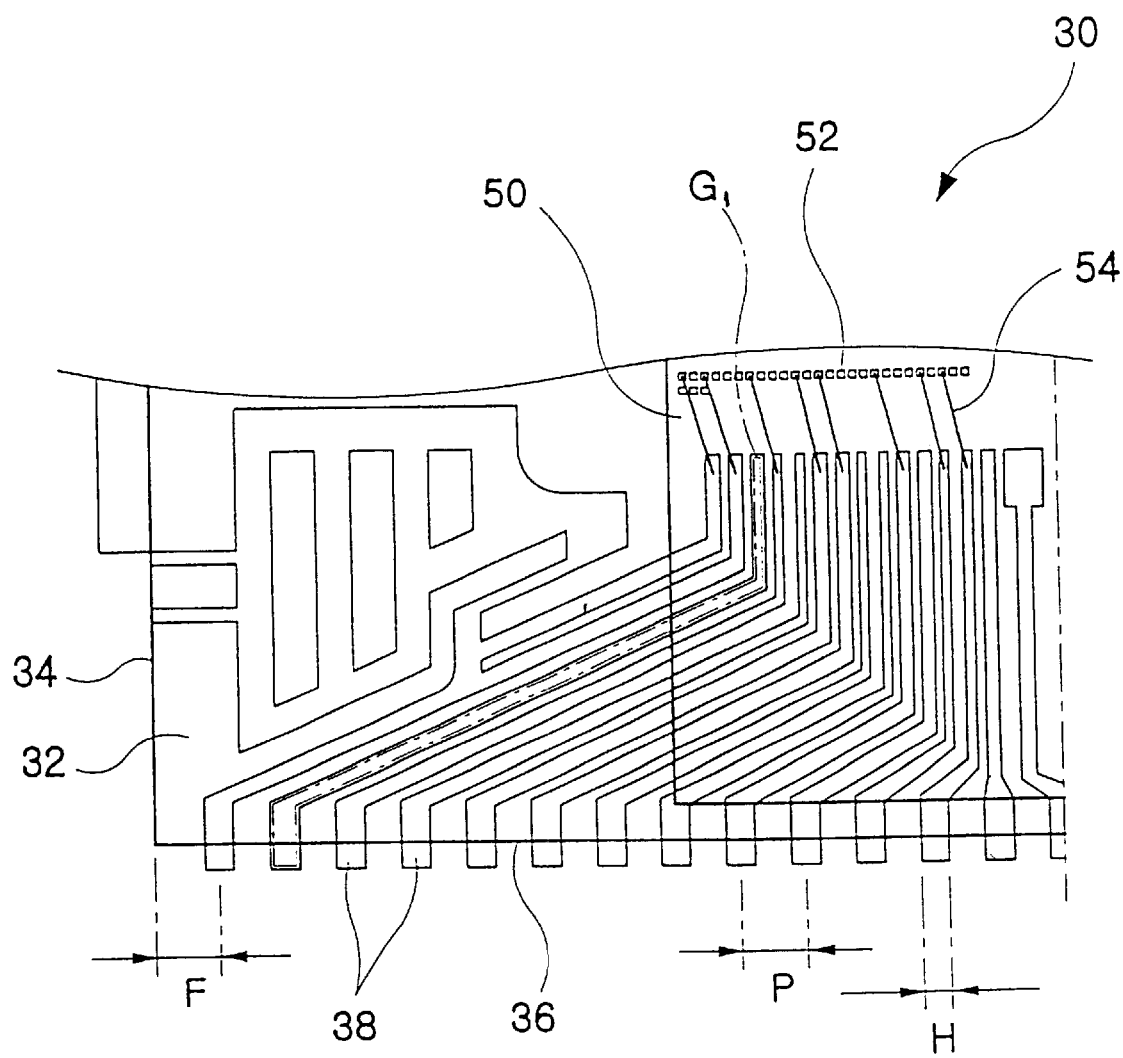
FIG. 5 is a plan view showing an internal structure of the conventional semiconductor package shown in FIG. 3.
Figure 6:
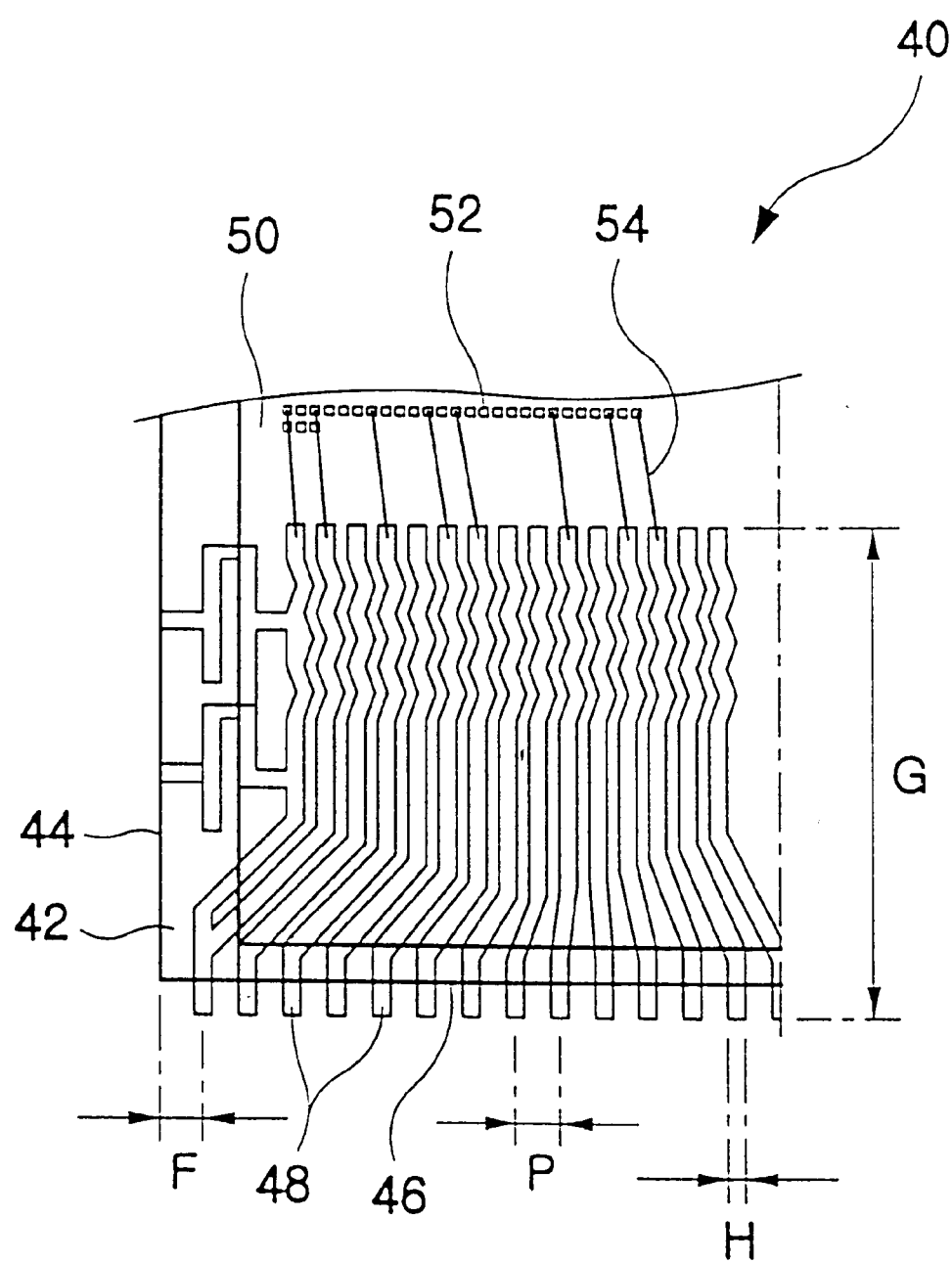
FIG. 6 is a plan view showing an internal structure of the improved semiconductor package shown in FIG. 4.

Thus, reductions in length of the package are possible in accordance with the present invention without decreasing the number of the pins by reducing the lead pitch. In accordance with the present invention, the reduction in lead pitch is realized by modifying an internal structure of the package. FIG. 5 illustrates, in a plan view, the internal structure of the conventional package (30) shown in FIG. 3, and FIG. 6 illustrates a preferred embodiment of the internal structure does that of the package (40) of the present invention shown in FIG. 4. FIGS. 5 and 6 show a quarter of the entire fifty-four TSOP, respectively.

Referring to FIGS. 5 and 6, a plurality of bonding pads (52) are formed on a top surface of a semiconductor chip (50). The plurality of bonding pads (52) are arranged parallel to the opposing second sides (36, 46) of the package body (32, 42) on a central region of the top surface. The bonding pads (52) are electrically connected to the leads (38, 48) via wires (54). Inner ends of the leads (i.e., inner leads) are provided within the package body (32, 42), while outer ends of the leads (i.e., outer leads) protrude from the package body along the opposing second sides (36, 46). The inner ends of the leads (38, 48) extend over and adhere to the top surface of the chip (50), so what is called a lead-on-chip structure, as well known in the art, is formed. Adhesion between the leads (38,48) and the chip (50) may be provided in any conventional manner, such as use of adhesive material such as polyimide tape (not shown). Although memory devices such as, for example, 128 Mb SDRAM (Synchronous DRAM) are preferably used for the semiconductor chip, other various types of memory devices having different densities can be alternatively used, as will be apparent to those skilled in the art.

As stated above, the lead pitch (P) in the present embodiment is reduced to 0.4±0.05 mm from 0.8±0.05 mm in the prior art. Moreover, a width (H) of each lead (38, 48) itself is reduced to 0.18+0.07 mm~0.18–0.03 mm in the present embodiment from 0.35+0.07 mm~0.35–0.03 mm in the prior art, and a distance (F) between a centerline of the outermost lead and an outermost extreme of the package body is reduced to 0.40 mm 1 mm. In addition, each lead (38) of the related art has a different length than the other leads (38), as illustrated in FIG. 5. In FIG. 5, (G) represents the length of one exemplary lead. In contrast, a length (G) of each lead (48) of the present invention is substantially equal to the length of the other leads (48), as shown in FIG. 6. Furthermore, the leads of the present invention are shorter than most of the leads of the related art. The similar lengths and reduced lengths of the leads of the present invention result in improvement in electrical characteristic of the leads. The similar length allows all leads to have relatively uniform electrical properties. The shortened leads improves the electrical properties of the leads themselves. Table 3 lists experimental results of some electrical properties in respective pins. As shown in Table 3, resistance (R), inductance (L), or apacitance (C) of the prior art is variable according to the pins, but that of the invention is almost same regardless of the pins.

TABLE 3

| Pin Number | R (mΩ) | | L (nH) | | C (pF) | |
|---|---|---|---|---|---|---|
| | Prior Art | Invention | Prior Art | Invention | Prior Art | Invention |
| 2 | 546.1 | 125.3 | 4.928 | 2.291 | 1.298 | 0.920 |
| 3 | 505.3 | 118.9 | 4.631 | 2.425 | 1.300 | 0.905 |
| 4 | 473.1 | 117.5 | 4.212 | 2.454 | 1.249 | 0.870 |
| 5 | 451.9 | 117.2 | 3.732 | 2.371 | 1.177 | 0.828 |
| 6 | 428.4 | 115.9 | 3.422 | 2.319 | 1.183 | 0.808 |
| 7 | 407.5 | 114.4 | 3.089 | 2.420 | 1.145 | 0.859 |
| 8 | 386.1 | 114.4 | 2.706 | 2.396 | 1.190 | 0.858 |
| 9 | 365.8 | 113.8 | 2.484 | 2.240 | 1.078 | 0.785 |
| 10 | 342.6 | 113.1 | 2.388 | 2.373 | 1.010 | 0.831 |
| 11 | 321.2 | 113.3 | 2.388 | 2.405 | 0.980 | 0.820 |
| 12 | 302.2 | 113.8 | 2.185 | 2.286 | 0.874 | 0.823 |
| 13 | 295.0 | 118.2 | 2.094 | 2.265 | 0.779 | 0.845 |

In accordance with the invention, there leads are preferably copper. The copper leads (48) have some wave-shaped portions for preventing their reliability from lowering. Such wave-shaped leads effectively minimize thermal transformation of the leads. Table 4 is a comparison of electrical and thermal properties between the invented package using the copper leads and the prior package using nickel-iron alloy leads.

TABLE 4

| | Lead Material | Electrical Resistivity (Ω · m) | Thermal Conductivity (W/m ° C.) |
|---|---|---|---|
| Invention | Copper | 0.43H10E(−7) | 172 |
| Prior Art | 42Ni/58Fe alloy | 0.58H10E(−6) | 15 |

As described above, the semiconductor package of the present invention can be considerably reduced as compared with the conventional package. Therefore, the present invention can provide the increase in memory density of the memory module by employing the reduced packages, following the standard of the memory module. In addition, the modification of the lead structure in the present invention provides improved electrical and thermal properties.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:
1. A semiconductor package comprising:
  a package body including opposing first sides defining a body width and opposing second sides defining a body length, the package body being substantially square;
  a semiconductor chip including a top surface and a plurality of bonding pads formed on the top surface, the plurality of bonding pads being arranged parallel to the opposing second sides on a central region of the top surface, the semiconductor chip being provided within the package body; and
  a plurality of leads, each having an inner end and an outer end, the inner ends extending over the top surface of the semiconductor chip within the package body and electrically connecting to the bonding pads, the outer ends protruding from the package body along the opposing second sides, wherein no leads protrude from the package body along the opposing first sides.

2. The semiconductor package of claim 1, wherein a length of each lead is substantially equal to a length of remaining leads of the plurality of leads.

3. The semiconductor package of claim 1, wherein the semiconductor package is a type of TSOP (Thin Small Outline Package).

4. The semiconductor package of claim 3, wherein the TSOP has fifty-four pins, a pin pitch of which is 0.4 ±0.0 5 mm.

5. The semiconductor package of claim 4, wherein the body width is 10.16±0.127 mm, the body length is 11.20±0.127 mm, and a distance from the outer ends at one second side to the opposing outer ends at the other second side is 11.76±0.2 mm.

6. The semiconductor package of claim 1, wherein the leads are copper.

7. The semiconductor package of claim 1, wherein a ratio of the body length to the body width of the package body ranges from substantially 0.9 to substantially 1.1.

8. A semiconductor package comprising:
a package body including opposing first sides having a first length and opposing second sides having a second length;
a semiconductor chip including a top surface and a plurality of bonding pads formed on the top surface, the plurality of bonding pads being arranged parallel to the opposing second sides on a central region of the top surface, the semiconductor chip being provided within the package body;
a plurality of leads, each having an inner lead and an outer lead, the inner leads extending over the top surface of the semiconductor chip within the package body, the outer leads protruding from the package body along the opposing second sides; and
a plurality of bond wires electrically connecting the plurality of leads to the plurality of bonding pads,
wherein the second length is longer than the first length and shorter than a distance from the outer leads at one of the second sides to the opposing outer leads at the other second side, and
wherein no leads protrude from the package body along the opposing first sides.

9. The semiconductor package of claim 8, wherein a length of each lead is substantially equal to a length of remaining leads of the plurality of leads.

10. The semiconductor package of claim 8, wherein the semiconductor package is a type of TSOP (Thin Small Outline Package).

11. The semiconductor package of claim 10, wherein the TSOP has fifty-four pins a pitch of which, i.e., a pitch between the adjacent outer leads, is 0.4±0.05 mm.

12. The semiconductor package of claim 11, wherein the first length is 10.16±0.127 mm, the second length is 11.20±0.127 mm, and the distance from the outer leads at one second side to the opposing outer leads at the other second side is 11.76±0.2 mm.

13. The semiconductor package of claim 8, wherein the leads are copper.

14. The semiconductor package of claim 8, wherein a ratio of the first length to the second length of the package body ranges from substantially 0.9 to substantially 1.0.

15. A memory module comprising:
a circuit substrate including upper and lower faces on each of which given circuit patterns are formed; and
a plurality of semiconductor packages, the semiconductor packages each having a package body including opposing first sides defining a body width and opposing second sides defining a body length, and outer leads protruding from the package body only along the opposing second sides, the package body being substantially square, said plurality of semiconductor packages being provided on the upper and lower faces and being electrically connected to the circuit patterns,
wherein the semiconductor packages on each face of the circuit substrate are arranged in at least two lengthwise rows and at least two widthwise rows.

16. The memory module of claim 15, wherein the memory module has a 1250±6 mil width, a 2660±6 mil length, and a 150 mil maximum thickness.

17. The memory module of claim 16, wherein each semiconductor package is a TSOP having fifty-four pins, a pin pitch of which is 0.4±0.05 mm.

18. The memory module of claim 15, wherein the body width of each semiconductor package is 10.16±0.127 mm, the body length of each semiconductor package is 11.20±0.127 mm, and a distance from the-outer leads at one second side of the semiconductor package to the opposing outer leads at the other second side is 11.76±0.2 mm.

19. The memory module of claim 15, wherein a ratio of the first length to the second length of each package body ranges from substantially 0.9 to substantially 1.1.

20. A memory module comprising:
a circuit substrate including upper and lower faces on each of which given circuit patterns are formed; and
a plurality of semiconductor packages, each semiconductor package comprising,
a package body including opposing first sides having a first length and opposing second sides having a second length;
a semiconductor chip including a top surface and a plurality of bonding pads formed on the top surface,
a plurality of leads, each having an inner lead and an outer lead, the inner leads extending over the top surface of the semiconductor chip within the package body, the outer leads protruding from the package body only along the opposing second sides, and
a plurality of bond wires electrically connecting the plurality of leads to the plurality of bonding pads,
wherein the second length is longer than the first length and shorter than a distance from the outer leads at one of the second sides to the opposing outer leads at the other second side, the plurality of semiconductor packages being provided on the upper and lower faces and electrically connected to the circuit patterns, and
wherein the packages on each face of the circuit substrate are arranged in at least two lengthwise rows and at least two widthwise rows.

21. The memory module of claim 20, wherein the memory module has a 1250±6 mil width, a 2660±6 mil length, and a 150 mil maximum thickness.

22. The memory module of claim 20, wherein each semiconductor package is a TSOP having fifty-four pins, a pin pitch of which is 0.4±0.05 mm.

23. The memory module of claim 22, wherein the first length of each semiconductor package is 10.16±0.127 mm, the second length of each semiconductor package is 11.20±0.127 mm, and a distance from the outer leads at one second side of each semiconductor package to the opposing outer leads at the other second side is 11.76±0.2 mm.

* * * * *